United States Patent
Wang et al.

(10) Patent No.: US 10,361,220 B2
(45) Date of Patent: Jul. 23, 2019

(54) METHOD OF FORMING FINFET CHANNEL AND STRUCTURES THEREOF

(71) Applicant: Taiwan Semiconductor Manufacturing Company, Ltd., Hsinchu (TW)

(72) Inventors: Chih-Hao Wang, Hsinchu County (TW); Ching-Wei Tsai, Hsinchu (TW); Kuo-Cheng Ching, Hsinchu County (TW); Jhon Jhy Liaw, Hsinchu County (TW); Wai-Yi Lien, Hsinchu (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 0 days.

(21) Appl. No.: 15/652,011

(22) Filed: Jul. 17, 2017

(65) Prior Publication Data
US 2017/0317109 A1 Nov. 2, 2017

Related U.S. Application Data

(62) Division of application No. 14/658,023, filed on Mar. 13, 2015, now Pat. No. 9,711,535.

(51) Int. Cl.
*H01L 27/12* (2006.01)
*H01L 21/84* (2006.01)
(Continued)

(52) U.S. Cl.
CPC .... *H01L 27/1211* (2013.01); *H01L 21/02236* (2013.01); *H01L 21/02532* (2013.01);
(Continued)

(58) Field of Classification Search
CPC .......... H01L 27/1211; H01L 29/66795; H01L 29/785; H01L 21/823431; H01L 21/02532;
(Continued)

(56) References Cited

U.S. PATENT DOCUMENTS 6,194,287 B1 * 2/2001 Jang .................. H01L 21/76229
257/E21.548
8,487,378 B2 7/2013 Goto et al.
(Continued)

OTHER PUBLICATIONS

Bart Van Zeghbroeck, "Principles of Semiconductor Devices", Ch. 2: Semiconductor Fundamentals, http://ecee.colorado.edu/~bart/book/book/chapter2/ch2_7.htm, Boulder, CO, 2007.

*Primary Examiner* — Su C Kim
(74) *Attorney, Agent, or Firm* — Haynes and Boone, LLP

(57) ABSTRACT

A method for fabricating a semiconductor device having a substantially undoped channel region includes performing an ion implantation into a substrate, depositing a first epitaxial layer over the substrate, and depositing a second epitaxial layer over the first epitaxial layer. In various examples, a plurality of fins is formed extending from the substrate. Each of the plurality of fins includes a portion of the ion implanted substrate, a portion of the first epitaxial layer, and a portion of the second epitaxial layer. In some embodiments, the portion of the second epitaxial layer of each of the plurality of fins includes an undoped channel region. In various embodiments, the portion of the first epitaxial layer of each of the plurality of fins is oxidized.

20 Claims, 14 Drawing Sheets

(51) Int. Cl.
*H01L 21/02* (2006.01)
*H01L 29/10* (2006.01)
*H01L 23/544* (2006.01)
*H01L 21/762* (2006.01)
*H01L 21/8234* (2006.01)
*H01L 29/66* (2006.01)

(52) U.S. Cl.
CPC .............. *H01L 21/76264* (2013.01); *H01L 21/823431* (2013.01); *H01L 21/845* (2013.01); *H01L 23/544* (2013.01); *H01L 29/1037* (2013.01); *H01L 29/1079* (2013.01); *H01L 29/1083* (2013.01); *H01L 29/66795* (2013.01); *H01L 2223/5442* (2013.01); *H01L 2223/54426* (2013.01); *H01L 2223/54453* (2013.01)

(58) Field of Classification Search
CPC ......... H01L 27/0886; H01L 21/823821; H01L 21/845; H01L 27/0924; H01L 29/1079; H01L 21/02236; H01L 21/76264; H01L 29/1083; H01L 23/544; H01L 29/1037; H01L 2223/5442; H01L 2223/54453; H01L 2223/54426

See application file for complete search history.

(56) References Cited

U.S. PATENT DOCUMENTS

| | | | |
|---|---|---|---|
| 8,674,413 B1* | 3/2014 | Chi | H01L 27/0924 257/213 |
| 8,729,634 B2 | 5/2014 | Shen et al. | |
| 8,826,213 B1 | 9/2014 | Ho et al. | |
| 8,859,389 B2 | 10/2014 | Kawasaki et al. | |
| 8,887,106 B2 | 11/2014 | Ho et al. | |
| 8,901,607 B2 | 12/2014 | Wang et al. | |
| 8,943,455 B2 | 1/2015 | Chen et al. | |
| 8,969,932 B2 | 3/2015 | Wei et al. | |
| 9,105,507 B2 | 8/2015 | Wei et al. | |
| 9,190,518 B2* | 11/2015 | Shah | H01L 29/42384 |
| 9,224,865 B2 | 12/2015 | Akarvardar et al. | |
| 9,385,233 B2 | 7/2016 | Akarvardar et al. | |
| 9,461,110 B1 | 10/2016 | Wang et al. | |
| 9,704,883 B2 | 7/2017 | Wang et al. | |
| 2012/0083082 A1* | 4/2012 | Fujita | H01L 21/823807 438/270 |
| 2013/0069196 A1 | 3/2013 | Cheng | |
| 2014/0312432 A1 | 10/2014 | Ching et al. | |
| 2015/0001591 A1* | 1/2015 | Akarvardar | H01L 29/785 257/288 |
| 2015/0021691 A1 | 1/2015 | Akarvardar et al. | |
| 2015/0021709 A1 | 1/2015 | Jacob et al. | |
| 2016/0322358 A1 | 11/2016 | Ching et al. | |

* cited by examiner

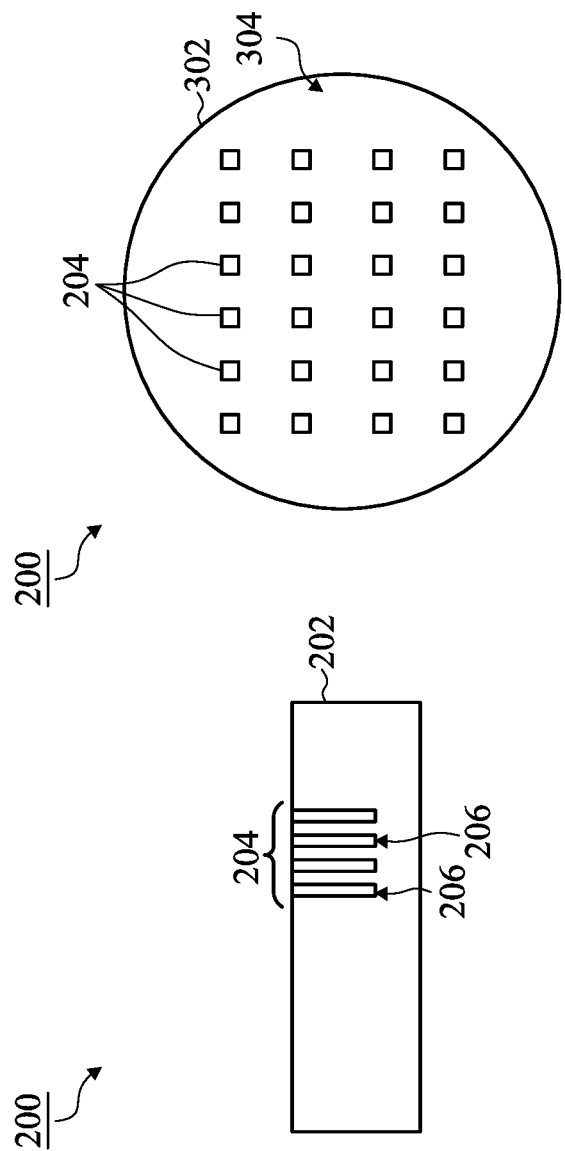

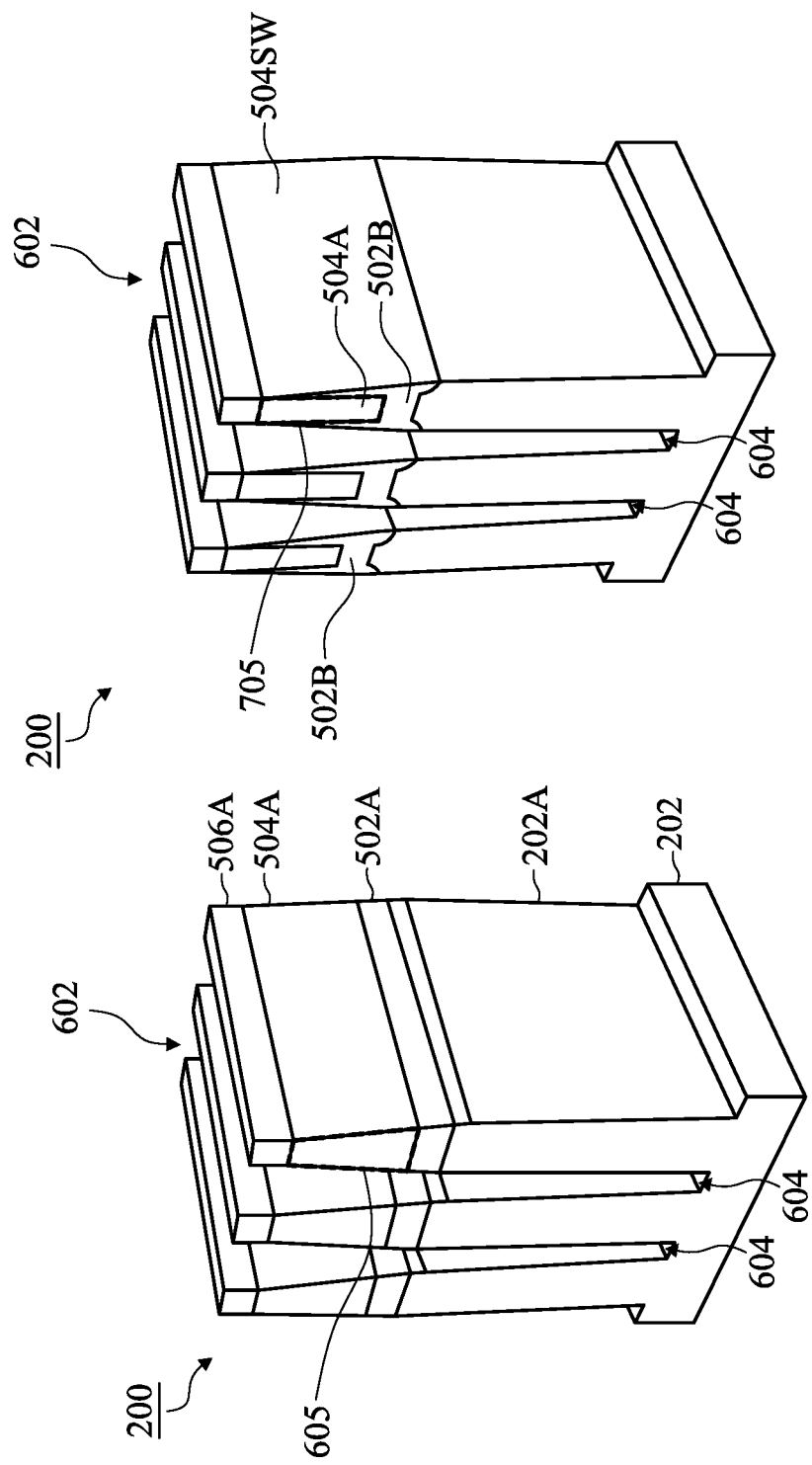

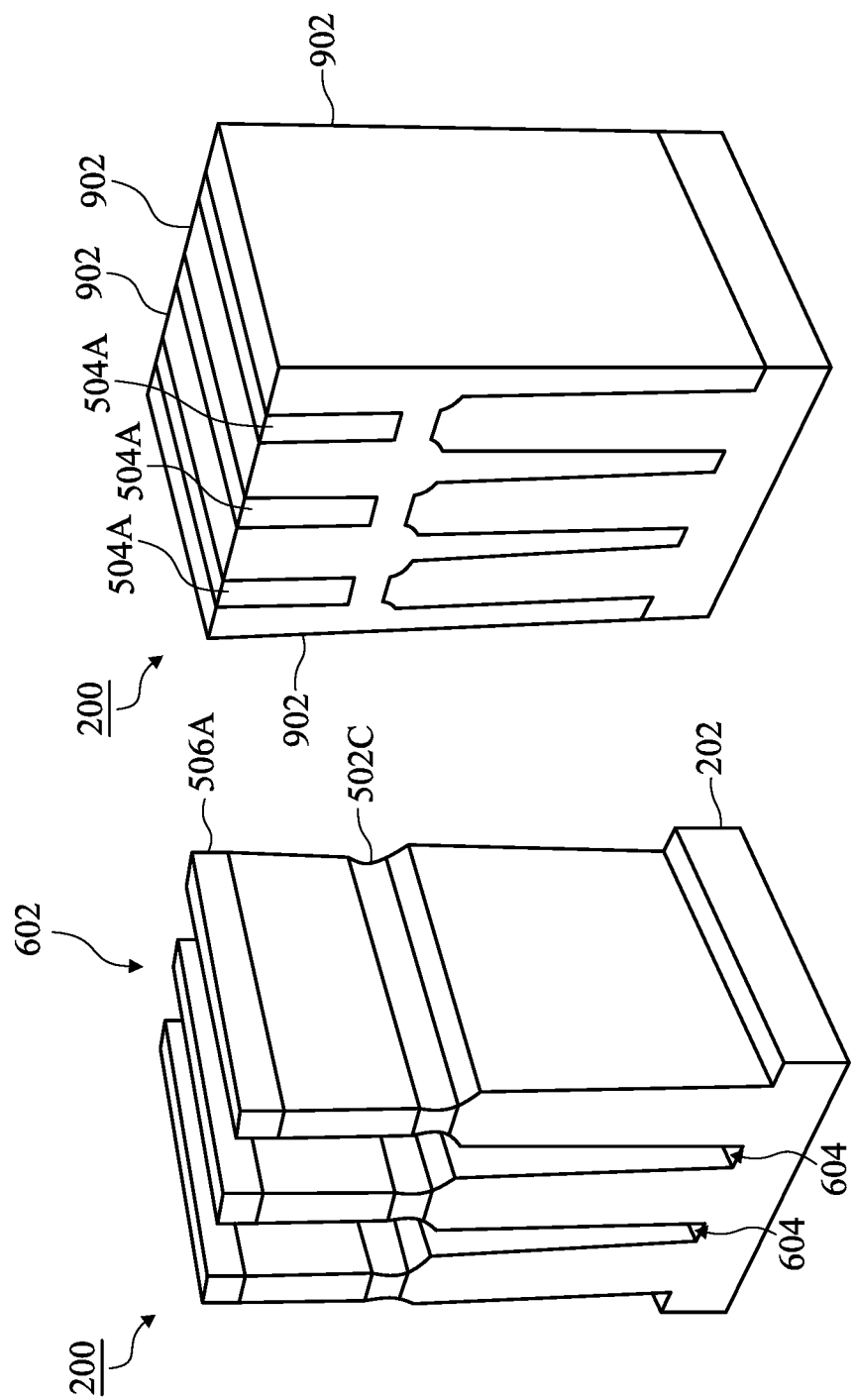

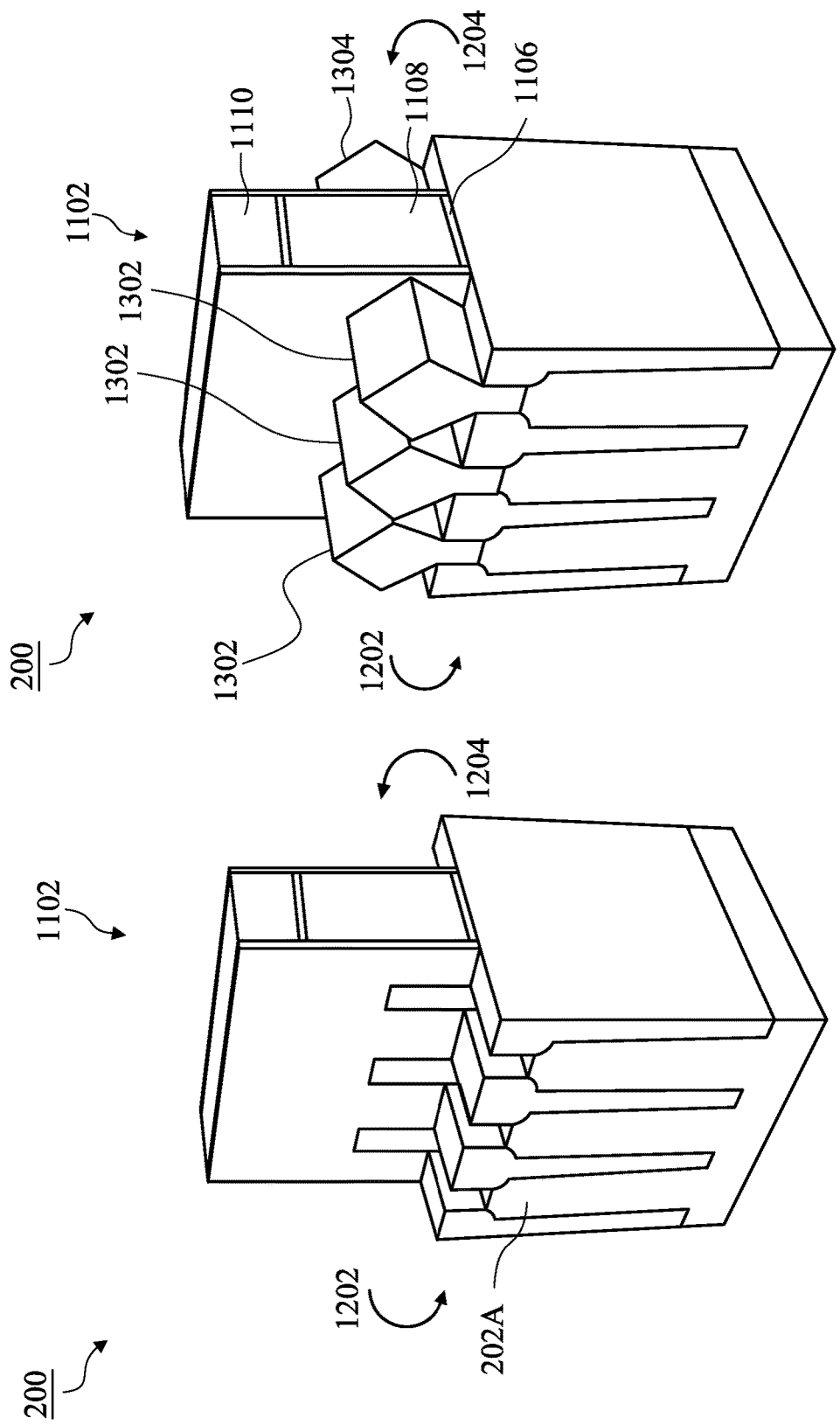

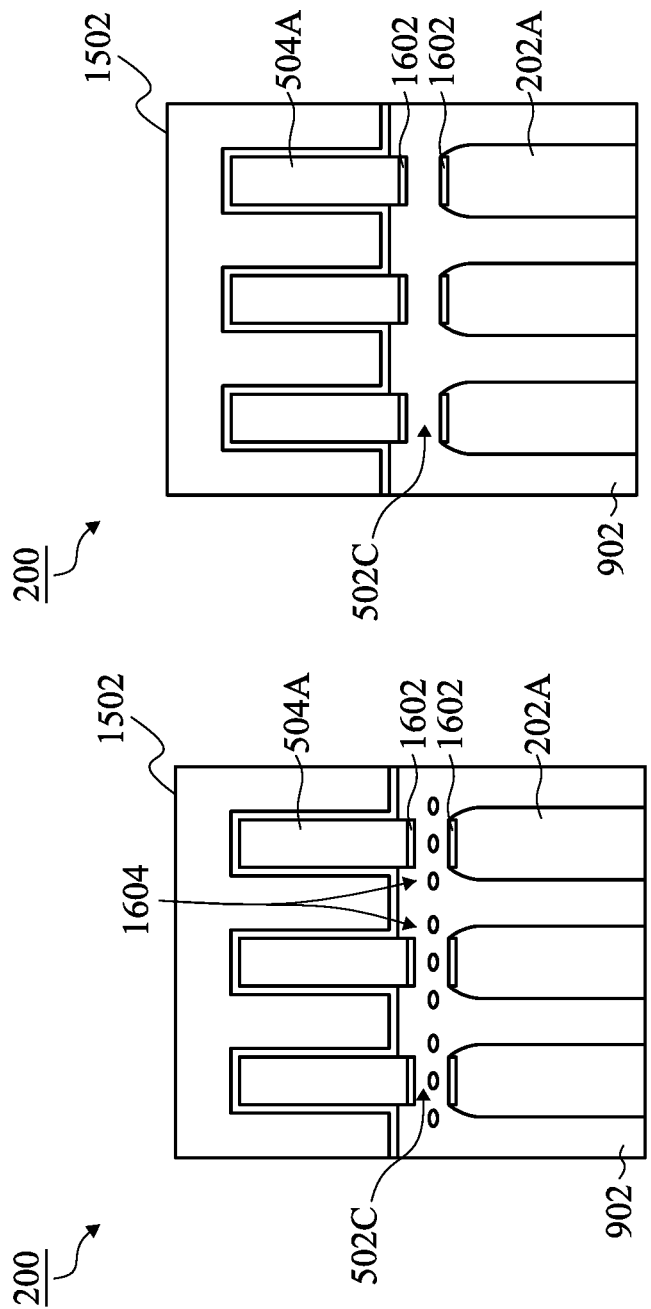

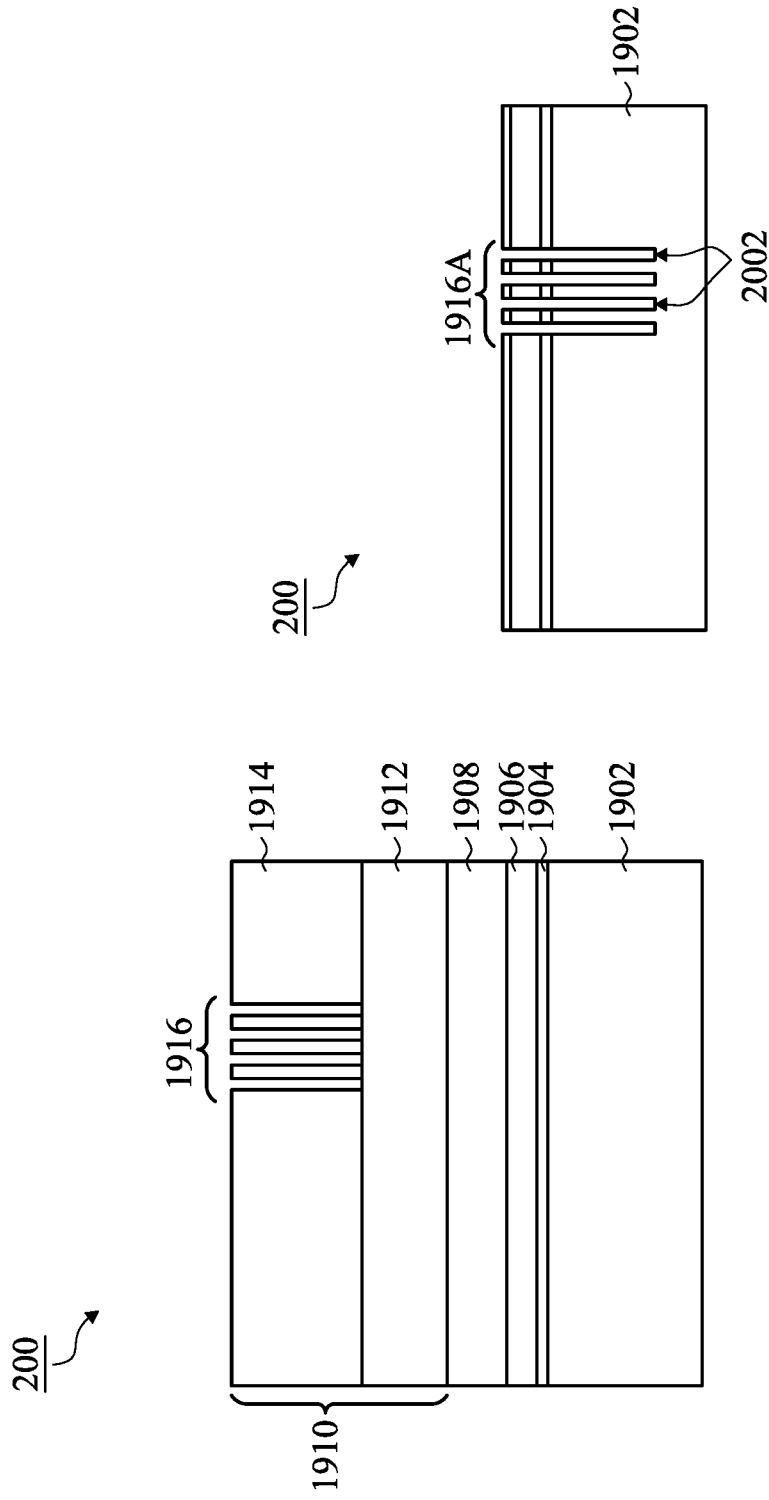

METHOD OF FORMING FINFET CHANNEL AND STRUCTURES THEREOF

PRIORITY DATA

The present application is a divisional patent application of U.S. patent application Ser. No. 14/658,023 filed on Mar. 13, 2015, which will issue as U.S. Pat. No. 9,711,535, the disclosure of which is hereby incorporated by reference in its entirety.

BACKGROUND

The electronics industry has experienced an ever increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

Recently, multi-gate devices have been introduced in an effort to improve gate control by increasing gate-channel coupling, reduce OFF-state current, and reduce short-channel effects (SCEs). One such multi-gate device that has been introduced is the fin field-effect transistor (FinFET). The FinFET gets its name from the fin-like structure which extends from a substrate on which it is formed, and which is used to form the FET channel. FinFETs are compatible with conventional complementary metal-oxide-semiconductor (CMOS) processes and their three-dimensional structure allows them to be aggressively scaled while maintaining gate control and mitigating SCEs. In conventional processes, an anti-punch through (APT) ion implantation is performed through FinFET fin elements to prevent punch through of FinFET source/drain depletion regions. However, ion implantation of dopants (e.g., dopants used for APT implants) through fins of FinFET devices directly contributes to the formation of defects and the introduction of impurities in a FinFET channel region. Such channel defects and impurities can cause scattering of carriers flowing through the FinFET channel, thus degrading channel mobility and adversely affecting device performance. Dopant implantation through FinFET fins may also result in a non-uniform doping profile, which among other issues can cause variability of FinFET device parameters. Thus, existing techniques have not proved entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2 is a cross-section view,

FIG. 3 is a top-view, and

FIGS. 4A, 4B, and 5-15 are isometric views of an embodiment of a device 200 according to aspects of the method of FIG. 1;

FIGS. 16 and 17 are cross-section views of the device 200 along a plane substantially parallel to section AA' of FIG. 15, before and after an anneal process, according to some embodiments;

FIGS. 19-25 are cross-section views of an embodiment of the device 200 according to aspects of the method 1800 of FIG. 18.

DETAILED DESCRIPTION

Figure 1:
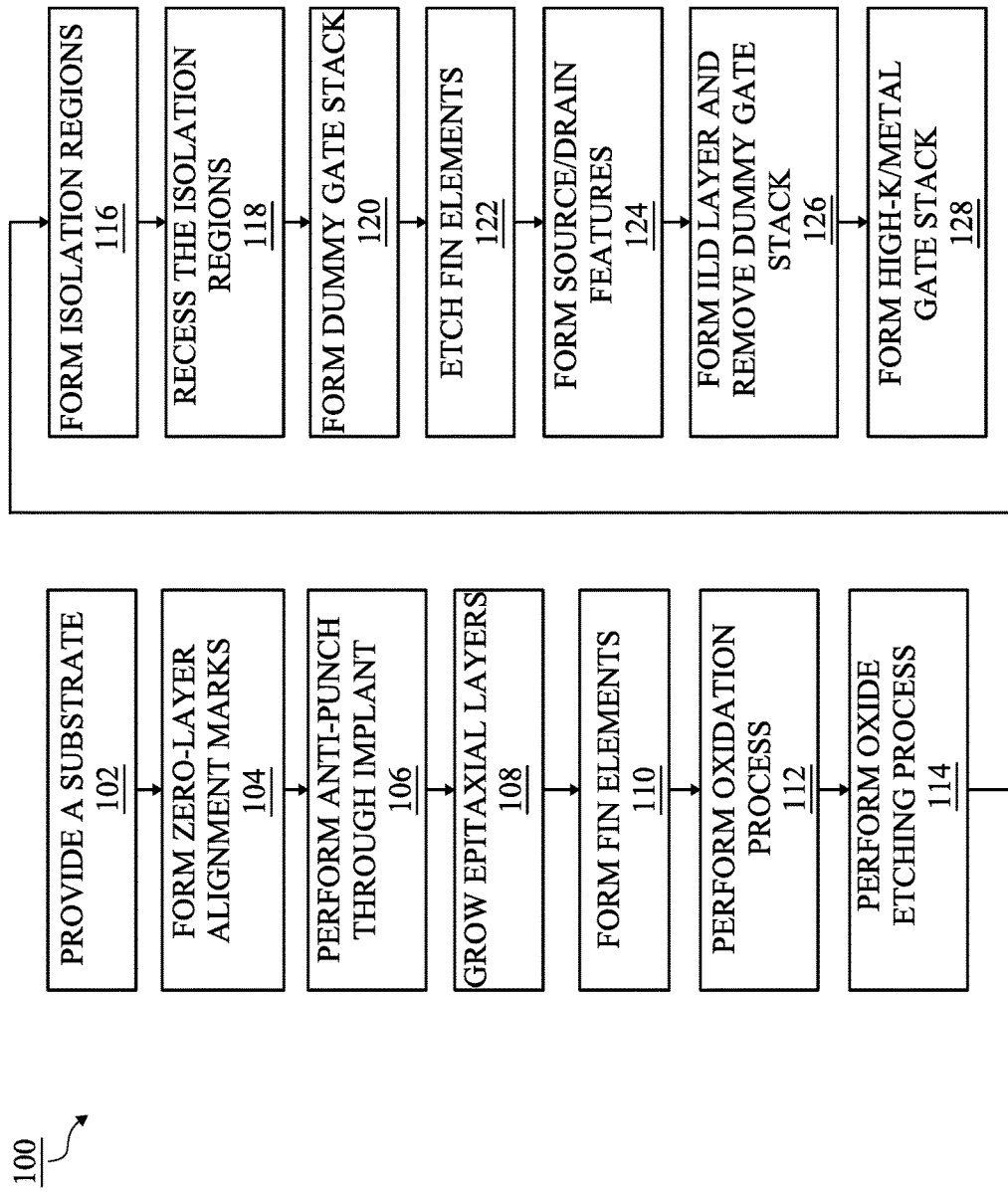
FIG. 1 is a flow chart of a method of fabricating a FinFET device or portion thereof according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is also noted that the present disclosure presents embodiments in the form of multi-gate transistors or fin-type multi-gate transistors referred to herein as FinFET devices. Such a device may include a P-type metal-oxide-semiconductor FinFET device or an N-type metal-oxide-semiconductor FinFET device. The FinFET device may be a dual-gate device, tri-gate device, bulk device, silicon-on-insulator (SOI) device, and/or other configuration. One of ordinary skill may recognize other examples of semiconductor devices that may benefit from aspects of the present disclosure. For example, some embodiments as described herein may also be applied to gate-all-around (GAA) devices, Omega-gate (Ω-gate) devices, or Pi-gate (π-gate) devices.

Illustrated in FIG. 1 is a method 100 of semiconductor fabrication including fabrication of fins having dopant-free channels disposed on a substrate. As used herein, the term "dopant-free" material is used to describe a material (e.g., a semiconductor material) having an extrinsic dopant concentration from about 0 cm$^{-3}$ to about 1×10$^{17}$ cm$^{-3}$. In some examples, as used herein, the term "undoped" may be used interchangeably with "dopant-free", having a similar meaning. In addition, in some embodiments, the terms "undoped" and "dopant-free", as used herein, may refer to substrate regions, fin regions, or other regions that are not purposefully doped (e.g., by an ion implantation process, diffusion process, or other doping process). As discussed below, the presence of dopants in a device channel may cause carrier scattering in the active device channel, which can substantially degrade device performance. Devices, such as FinFET devices, having a substantially dopant-free epitaxially grown undoped channel region, as described below, may result in significantly improved device performance (e.g., increased device ON-current). A "dopant" or "extrinsic dopant", as used herein, is used to describe an impurity (e.g., B, P, As, etc.) that can be introduced into a semiconductor lattice for the purpose of changing the electrical properties of the semiconductor. For example, N-type impurities may be introduced into a semiconductor to form an N-type material, and P-type impurities may be introduced into a semiconductor to form a P-type material. It is understood that the method 100 includes steps having features of a complementary metal-oxide-semiconductor (CMOS) technology process flow and thus, are only described briefly herein. Additional steps may be performed before, after, and/or during the method 100.

FIG. 2 is a cross-section view, FIG. 3 is a top-view, and FIGS. 4A, 4B, and 5-15 are isometric views of an embodiment of a semiconductor device 200 according to various stages of the method 100 of FIG. 1. It is understood that parts of the semiconductor device 200 may be fabricated by complementary metal-oxide-semiconductor (CMOS) technology process flow, and thus some processes are only briefly described herein. Further, the semiconductor device 200 may include various other devices and features, such as other types of devices such as additional transistors, bipolar junction transistors, resistors, capacitors, inductors, diodes, fuses, static random access memory (SRAM) and/or other logic circuits, etc., but is simplified for a better understanding of the inventive concepts of the present disclosure. In some embodiments, the semiconductor device 200 includes a plurality of semiconductor devices (e.g., transistors), including PFETs, NFETs, etc., which may be interconnected. Moreover, it is noted that the process steps of method 100, including any descriptions given with reference to FIGS. 2-15, are merely exemplary and are not intended to be limiting beyond what is specifically recited in the claims that follow.

The method 100 begins at block 102 where a substrate is provided. Referring to FIG. 2, in an example of block 102, a substrate 202 is provided. In some embodiments, the substrate 202 may be a semiconductor substrate such as a silicon substrate. The substrate 202 may include various layers, including conductive or insulating layers formed on a semiconductor substrate. The substrate 202 may include various doping configurations depending on design requirements as is known in the art. The substrate 202 may also include other semiconductors such as germanium, silicon carbide (SiC), silicon germanium (SiGe), or diamond. Alternatively, the substrate 202 may include a compound semiconductor and/or an alloy semiconductor. Further, the substrate 202 may optionally include an epitaxial layer (epi-layer), may be strained for performance enhancement, may include a silicon-on-insulator (SOI) structure, and/or have other suitable enhancement features.

The method 100 then proceeds to block 104 where zero-layer alignment marks are formed. Referring to FIGS. 2 and 3, an example of block 104 is shown. Specifically, the example of FIG. 2 illustrates a zero-layer alignment mark 204 formed within the substrate 202 of the device 200. As shown in FIG. 2, the alignment mark 204 may include a plurality of trenches 206 formed within the substrate 202. In various examples, each trench of the plurality of trenches 206 is filled with a dielectric material (e.g., silicon oxide). Additional details of an exemplary process flow that may be used to form the alignment mark 204 are given below with reference to FIGS. 18-25. The example of FIG. 3 illustrates a plurality of alignment marks 204, which may be formed within a top surface 304 of a semiconductor wafer 302. In various embodiments, the wafer 302 is equivalent to the substrate 202, described above. In some embodiments, one or more photomasks (used in subsequent processing of the device 200) may be aligned to the zero-layer alignment marks 204. In some examples, by aligning subsequent photomasks to the same alignment marks 204 formed within the substrate 202, registration and overlay errors may be reduced. In various examples, alignment of a pattern (e.g., as defined by a photomask), used for performing an APT implant into the substrate 202, may be aligned to the alignment marks 204, as described below.

Figure 4B:
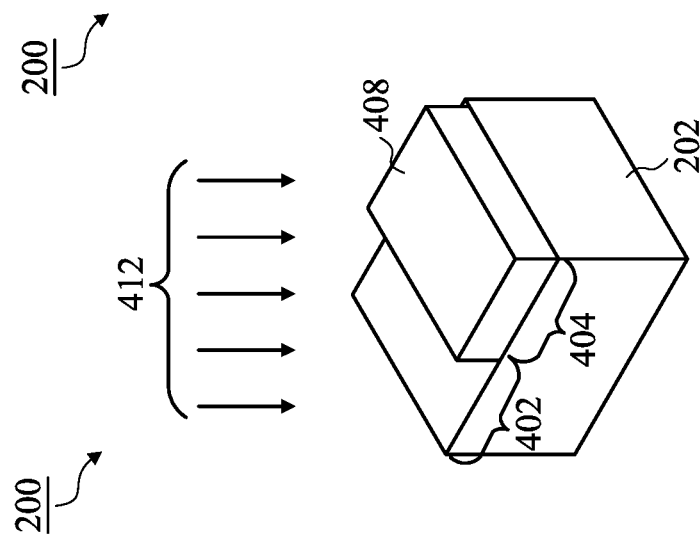
Figure 4A:
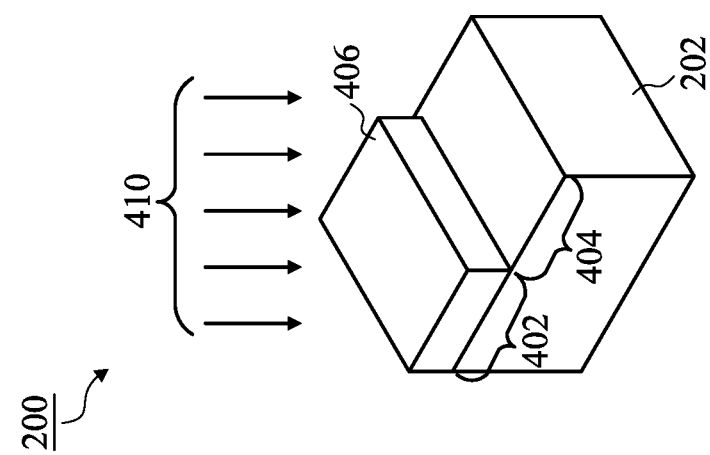
Figure 11:
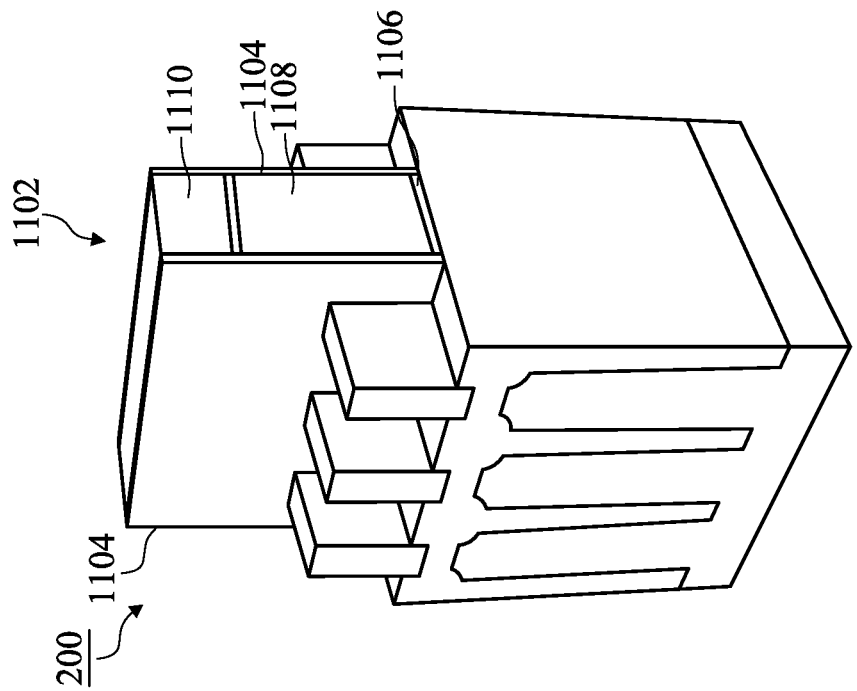
Figure 10:
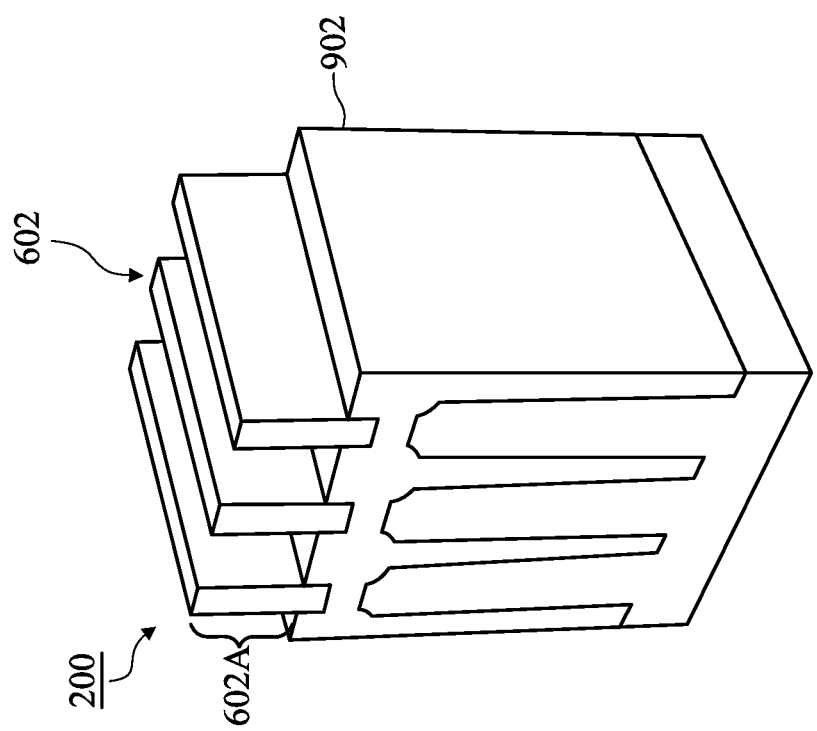

The method 100 then proceeds to block 106 where an APT implant is performed. Referring to FIGS. 4A and 4B, an example of block 106 is shown. In some embodiments, a first photolithography (photo) step is performed to pattern a P-type APT region 404 and a second photo step is performed to pattern an N-type APT region 402. For example, in some embodiments, performing the first photo step may include forming a photoresist layer (resist) over the substrate 202, exposing the resist to a pattern (e.g., P-type APT implant mask), performing post-exposure bake processes, and developing the resist to form a patterned resist layer 406. As shown in FIG. 4A, after formation of the patterned resist layer 406, an ion implantation process 410 is performed into the P-type APT region 404 of the substrate 202, while the N-type APT region 402 remains masked by the resist layer 406. By way of example, a P-type dopant implanted via the ion implantation process 410 into the P-type APT region 404 may include boron, aluminum, gallium, indium, or other P-type acceptor material. After the ion implantation process 410, the resist layer 406 may be removed, for example, by way of a solvent, resist stripper, ashing, or other suitable technique. Thereafter, in some embodiments, the second photo step may be performed, where the second photo step may include forming a resist layer over the substrate 202, exposing the resist to a pattern (e.g., N-type APT implant mask), performing post-exposure bake processes, and developing the resist to form a patterned resist layer 408. As shown in FIG. 4B, after formation of the patterned resist layer 408, an ion implantation process 412 is performed into the N-type APT region 402 of the substrate 202, while the P-type APT region 404 remains masked by the resist layer 408. By way of example, an N-type dopant implanted via the ion implantation process 412 into the N-type APT region 402 may include arsenic, phosphorous, antimony, or other N-type donor material. After the ion implantation process 412, the resist layer 408 may be removed, for example, by way of a solvent, resist stripper, ashing, or other suitable technique. It will be understood that the first and second photo steps may be performed in any order, for example, the N-type APT region 402 may be implanted before the P-type APT region 404. Additionally, in various embodiments, an APT implant may have a high dopant concentration, for example, of between about $1 \times 10^{18}$ cm$^{-3}$ and $1 \times 10^{19}$ cm$^{-3}$. Such a high APT dopant concentration may be used, as described below, because of the presence of a subsequently formed dielectric layer over the APT-implanted substrate, which serves as a dopant diffusion barrier.

By performing the APT implant processes 410, 412 prior to formation of FinFET fin structures, FinFET fin damage and device degradation can be avoided. For example, in existing semiconductor process flows, ion implantation processes (e.g., APT ion implant processes) are performed through FinFET fin elements, described below, which can result in damage to the fin elements, including damage to a FinFET channel region, which can lead to carrier scattering and thus degrade device performance. Although a high temperature anneal may be used in an attempt to remove such defects (as well as for dopant activation), all defects introduced by ion implantation may not be removed and the substrate (or fin elements) may thus not be fully restored to its pre-ion implant condition. In addition, dopant implantation through FinFET fin elements may result in a non-uniform doping profile that includes dopants distributed within the FinFET channel region. As known in the art, increased doping concentrations in a device channel can lead to decreased device mobility due to ionized impurity scattering.

Embodiments of the present disclosure offer advantages over the existing art, though it is understood that other embodiments may offer different advantages, not all advantages are necessarily discussed herein, and no particular advantage is required for all embodiments. For example, embodiments discussed herein include methods and structures for avoiding degradation to semiconductor devices that can occur due to ion implantation processes, such as APT ion implantation processes, including defect formation and the introduction of channel impurities. In some embodiments, an N-type APT region 402 and/or P-type APT region 404 are implanted, as described above, prior to formation of FinFET fin elements, as described below. Thus, APT ion implant induced degradation is avoided. The N-type and/or P-type APT implants may be aligned to the substrate 202 via one or more zero-layer alignment marks 204, as described above. In some embodiments, an epitaxially grown undoped channel layer is formed over the APT-implanted substrate, as described below. Moreover, in various embodiments, the epitaxially grown undoped channel layer is separated from the APT-implanted substrate by an oxide layer, which serves as a barrier to APT dopants. Because of this advantageous oxide barrier layer, the APT implant may have a high dopant concentration, for example, of between about $1 \times 10^{18}$ cm$^{-3}$ and $1 \times 10^{19}$ cm$^{-3}$. In some embodiments, because the epitaxially grown undoped channel layer is substantially free of dopants, carrier channel scattering is mitigated, and device mobility and drive current are improved. In various embodiments, the undoped channel layer (and thus the active device channel) has a dopant concentration of less than about $1 \times 10^{17}$ cm$^{-3}$. As described below, the methods and structures described herein may be applied to NFET or PFET devices. Further, while the discussion herein is directed primarily to FinFET devices, one of ordinary skill in the art in possession of this disclosure will appreciate that the methods and structures described herein may be equally applicable to other types of devices without departing from the scope of the present disclosure.

Figure 5:
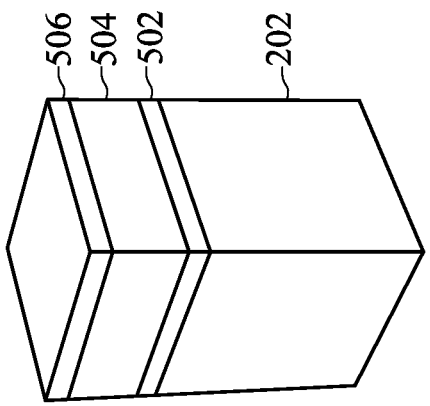

Returning to FIG. 1, the method 100 then proceeds to block 108 where one or more epitaxial layers are grown. With reference to FIG. 5, in an example of block 108, an epitaxial layer 502 is formed over the APT-implanted substrate 202, and an epitaxial layer 504 is formed over the epitaxial layer 502. In some embodiments, the epitaxial layer 502 has a thickness range of about 2-10 nm. In some embodiments, the epitaxial layer 504 has a thickness range of about 30-60 nm. By way of example, epitaxial growth of the layers 502, 504 may be performed by a molecular beam epitaxy (MBE) process, a metalorganic chemical vapor deposition (MOCVD) process, and/or other suitable epitaxial growth process. In some embodiments, the epitaxially grown layers 502, 504 include the same material as the substrate 202. In some embodiments, the epitaxially grown layers 502, 504 include a different material than the substrate 202. In at least some examples, the epitaxial layer 502 includes an epitaxially grown silicon germanium (SiGe) layer and the epitaxial layer 504 includes an epitaxially grown silicon (Si) layer. Alternatively, in some embodiments, either of the epitaxial layers 502, 504 may include other materials such as germanium, a compound semiconductor such as silicon carbide, gallium arsenide, gallium phosphide, indium phosphide, indium arsenide, and/or indium antimonide, an alloy semiconductor such as SiGe, GaAsP, AlInAs, AlGaAs, InGaAs, GaInP, and/or GaInAsP, or combinations thereof. In various embodiments, the epitaxial layers 502, 504 are substantially dopant-free (i.e., having an extrinsic dopant concentration from about 0 cm$^{-3}$ to about $1 \times 10^{17}$ cm$^{-3}$), where for example, no intentional doping is performed during the epitaxial growth process. As described in more detail below, the epitaxially grown undoped epitaxial layer 504 may serve as a channel region for a FinFET device. Thus, carrier scattering through the FinFET channel will be substantially reduced for FinFET devices including the substantially dopant-free epitaxially grown undoped epitaxial layer 504 described herein.

In various embodiments the epitaxial layer 502 has a first oxidation rate, and the epitaxial layer 504 has a second oxidation rate less than the first oxidation rate. For example, in embodiments where the epitaxial layer 502 includes SiGe and where the epitaxial layer 504 includes Si, the Si oxidation rate of the epitaxial layer 504 is less than the SiGe oxidation rate of the epitaxial layer 502. During a subsequent oxidation process (after formation of FinFET fin elements), as discussed below, the portions of the fin elements including the epitaxial layer 502 may be fully oxidized, while only sidewalls of fin elements including the epitaxial layer 504 may be oxidized. In some embodiments, the fully oxidized portions of the fin elements including the epitaxial layer 502 serve as a diffusion barrier to APT dopants previously implanted into the substrate 202, for example, so that the APT dopants will not diffuse into a subsequently formed FinFET channel. Also, in some embodiments, the sidewall oxidation of fin elements including the epitaxial layer 504 serves to fine tune a shape of the fin elements which form a FinFET channel, as discussed below.

As also shown in the example of FIG. 5, a dielectric layer 506 may be formed over the epitaxial layer 504. In some embodiments, the dielectric layer 506 includes a pad nitride layer (e.g., $Si_3N_4$) which may be deposited by CVD or other suitable technique. In some examples, the dielectric layer 506 includes a pad oxide layer (e.g., $SiO_2$) and the pad nitride layer formed over the pad oxide layer. In some embodiments, the pad oxide layer may include thermally grown oxide, CVD-deposited oxide, and/or ALD-deposited oxide. By way of example, the pad oxide layer (if present) may have a thickness of between approximately 5 nm and approximately 40 nm. In some embodiments, the pad nitride layer (e.g., $Si_3N_4$) may have a thickness of between approximately 20 nm and approximately 160 nm.

The method 100 then proceeds to block 110 where fin elements, used for subsequent FinFET formation, are formed. With reference to FIG. 6, in an example of block 110, a plurality of fin elements 602 extending from the substrate 202 are formed. In various embodiments, each of the fin elements 602 includes a substrate portion 202A formed from the substrate 202, a first epitaxial layer portion 502A formed from the epitaxial layer 502, a second epitaxial layer portion 504A formed from the epitaxial layer 504, and a dielectric layer portion 506A formed from the dielectric layer 506.

The fins 602, like the substrate 202, may include silicon or another elementary semiconductor, such as germanium; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, InGaAs, GaInP, and/or GaInAsP; or combinations thereof. The fins 602 may be fabricated using suitable processes including photolithography and etch processes. The photolithography process may include forming a photoresist layer over the substrate 202 (e.g., over the dielectric layer 506 of FIG. 5), exposing the resist to a pattern, performing post-exposure bake processes, and developing the resist to form a masking element including the resist. In some embodiments, patterning the resist to form the masking element may be performed using an electron beam (e-beam) lithography process. The masking element may then be used to protect regions of the substrate 202, and layers formed thereupon, while an etch process forms trenches 604 in unprotected regions through the dielectric layer 506, through the epitaxial layers 502, 504, and into the substrate 202, thereby leaving the plurality of extending fins 602. The trenches 604 may be etched using a dry etch (e.g., reactive ion etching), a wet etch, and/or other suitable processes. Numerous other embodiments of methods to form the fins on the substrate may also be used. As described in more detail below, and in some embodiments, the second epitaxial layer portion 504A will serve as a FinFET device channel. Moreover, because the second epitaxial layer portion 504A is undoped, and remains undoped throughout device fabrication as discussed below, the FinFET channel region thus remains substantially free of dopants. Therefore, in accordance with embodiments of the present disclosure, FinFET carrier channel scattering is mitigated, and device mobility and drive current are improved.

It is also noted that formation of the fin elements 602 may result in tapering of the second epitaxial layer portion 504A, and thus of a subsequent FinFET channel region, as shown by dashed line 605. In various embodiments, such fin element tapering is not desirable for optimal device performance. Thus, as described below, embodiments of the present disclosure include a process for creating a more vertical sidewall of the second epitaxial layer portion 504A.

The method 100 then proceeds to block 112 where an oxidation process is performed. With reference to FIGS. 6 and 7, in an example of block 112, the device 200 is exposed to an oxidation process that fully oxidizes the first epitaxial layer portion 502A of each of the plurality of fin elements 602, resulting in oxidized layer 502B. As shown in FIG. 7, the oxidation process also oxidizes sidewalls 504SW of the second epitaxial layer portion 504A. Upon oxidation of the sidewalls 504SW, the tapering of the second epitaxial layer portion 504A is reduced (i.e., the second epitaxial layer portion 504A has a more vertical sidewall), as indicated by dashed line 705. As described above, in some embodiments, the first epitaxial layer portion 502A includes a material having a first oxidation rate, and the second epitaxial layer portion 504A includes a material having a second oxidation rate less than the first oxidation rate. By way of example, in embodiments where the first epitaxial layer portion 502A includes SiGe, and where the second epitaxial layer portion 504A includes Si, the faster SiGe oxidation rate (i.e., as compared to Si) ensures that the SiGe layer (i.e., the first epitaxial layer portion 502A) is fully oxidized while only a sidewall portion of the Si layer (i.e., the second epitaxial layer portion 504A) is oxidized. In this manner, the fully oxidized layer 502B of each of the fin elements 602 serves as a diffusion barrier to APT dopants previously implanted into the substrate 202, and which may be present in the substrate portion 202A directly below the oxidized layer 502B. Thus, in various embodiments, the oxidized layer 502B serves to prevent APT dopants within the substrate portion 202A from diffusing into the second epitaxial layer portion 504A, which serves as a channel region for a subsequently formed FinFET device. Additionally, by oxidizing only a sidewall 504SW of the second epitaxial layer portion 504A, the profile of the second epitaxial layer portion 504A may be tuned to have a more vertical profile and thereby improve FinFET device performance.

In some examples, the oxidation process may be performed by exposing the device 200 to a wet oxidation process, a dry oxidation process, or a combination thereof. In at least some embodiments, the device 200 is exposed to a wet oxidation process using water vapor or steam as the oxidant, at a pressure of about 1 ATM, within a temperature range of about 400-600° C., and for a time from about 0.5-2 hours. It is noted that the oxidation process conditions provided herein are merely exemplary, and are not meant to be limiting in any way. It will be understood by those skilled in the art that the oxidation process conditions may be chosen so as to tune the fin shape (e.g., the shape of the second epitaxial layer portion 504A) to any of a plurality of profiles as may be desirable for a given device design, process technology, or other process conditions. Also, it will be understood that any of the plurality of materials discussed above may be selected for each of the first and second epitaxial layer portions 502A, 504A, as long as the oxidation rate of the second epitaxial layer portion 504A is less than the oxidation rate of the first epitaxial layer portion 502A.

The method 100 then proceeds to block 114 where an oxide etching process is performed. With reference to FIGS. 7 and 8, in an example of block 114, the device 200 may be exposed to an etching process that serves to remove the oxide layer from the sidewalls 504SW of the second epitaxial layer portion 504A of each fin element of the plurality of fin elements 602. As shown in FIG. 8, the etching process may also remove a portion of the oxidized layer 502B, resulting in an oxidized layer 502C. In some embodiments, the etching process includes an isotropic wet etching process that forms the curved profile of the oxidized layer 502C. In some examples, the etchant used for the isotropic wet etching process may include a dilute mixture of hydrofluoric acid (HF) (e.g., 49% HF in $H_2O$ by weight) and de-ionized (DI) $H_2O$, where the $HF:H_2O$ ratio is approximately 1:50, approximately 1:100, or other suitable ratio. Alternatively, in some embodiments, the etching process may include a dry etching process or a combination of a dry/wet etching process.

The method 100 then proceeds to block 116 where isolation regions are formed. With reference to FIGS. 8 and 9, in an example of block 116, a plurality of isolation regions 902 are formed. In some embodiments, the plurality of isolation regions 902 may include a plurality of shallow trench isolation (STI) features. By way of example, in some embodiments, a dielectric is deposited over the substrate 202, filling the trenches 604 with the dielectric, and forming the isolation regions 902. In some embodiments, the dielectric used to form the isolation regions 902 includes $SiO_2$, silicon nitride, silicon oxynitride, fluorine-doped silicate glass (FSG), a low-k dielectric, combinations thereof, and/or other suitable materials known in the art. The dielectric used in the formation of the isolation regions 902 may be deposited by a CVD process, a subatmospheric CVD (SACVD) process, a flowable CVD process, an ALD process, a PVD process, or other suitable process. In some embodiments, the dielectric used in the formation of the isolation regions 902 is annealed to improve the quality of the dielectric. In some embodiments, a field oxide, a LOCOS feature, and/or other suitable isolation features may be implemented on and/or within the substrate. However, other embodiments are possible. For example, in some embodiments, the isolation regions 902 may include a multi-layer structure, for example, having one or more liner layers. After deposition of the dielectric used in the formation of the isolation regions 902, the deposited dielectric is thinned and planarized, for example by a CMP process. With reference to FIG. 9, illustrated therein is the device 200 at an intermediate processing stage where a CMP process has been performed to remove excess dielectric material (used to form the isolation regions 902) and planarize a top surface of the device 200. In some embodiments, the isolation regions 902 are configured to isolate fin active regions (e.g., the second epitaxial layer portion 504A).

Referring to FIGS. 8 and 9, and in some embodiments, the CMP process used to planarize the dielectric material of the isolation regions 902 may also serve to remove the dielectric layer portion 506A from each of the plurality of fin elements 602. In some embodiments, removal of the dielectric layer portion 506A includes removal of a pad nitride layer. In some embodiments, removal of the dielectric layer portion 506A includes removal of both a pad nitride layer and a pad oxide layer. Removal of the dielectric layer portion 506A, including one or both of the pad nitride and the pad oxide, may alternately be performed by using a suitable etching process (e.g., dry or wet etching). Whether by using a CMP process or an etching process, upon removal of the dielectric layer portion 506A from the top of each of the fin elements 602, the underlying second epitaxial layer portion 504A of each of the fin elements 602 is exposed.

The method 100 then proceeds to block 118 where the isolation regions are recessed. Referring to the example of FIG. 10, in an embodiment of block 118, the isolation regions 902 around the fin elements 602 are recessed to laterally expose an upper portion 602A of the fin elements 602. In some embodiments, the recessing process may include a dry etching process, a wet etching process, and/or a combination thereof. For example, the recessing process may include a dry, plasma-free process using a reaction gas or reaction gas combination, such as $HF+NH_3$, $NF_3+NH_3$, and/or other suitable reaction gases. In some embodiments, the dry, plasma-free recessing process is performed using a CERTAS® Gas Chemical Etch System, available from Tokyo Electron Limited, Tokyo, Japan. In some embodiments, the dry, plasma-free recessing process is performed using a SICONI® System, available from Applied Materials, Inc., Santa Clara, Calif. In some examples, the recessing process may include a wet etch performed using a dilute mixture of HF (e.g., 49% HF in $H_2O$ by weight) and de-ionized (DI) $H_2O$, where the $HF:H_2O$ ratio is approximately 1:50, approximately 1:100, or other suitable ratio. In some embodiments, a recessing depth is controlled (e.g., by controlling an etching time) so as to result in a desired height 'H' of the exposed upper portion 602A.

The method 100 then proceeds to block 120 where a gate stack is formed. Referring to the example of FIG. 11, in an embodiment of block 120, a gate stack 1102 and sidewall spacers 1104 disposed on sidewalls of the gate stack 1102 are formed. In an embodiment, the gate stack 1102 is a dummy gate stack. In other embodiments of the method 100, the gate stack 1102 may be a high-k/metal gate stack. While the method 100 is described below with reference to a replacement gate process, those skilled in the art will readily appreciate that the methods and structures disclosed herein may equally apply to a gate-first process. In some examples, a gate-first process includes formation of a gate stack prior to source/drain formation or source/drain dopant activation. Merely by way of example, a gate-first process may include gate dielectric and metal gate depositions, followed by a gate stack etch process to define a gate critical dimension (CD). In some embodiments of a gate-first process, gate stack formation may be followed by source/drain formation including doping of source/drain regions and, in some examples, annealing for source/drain dopant activation.

In one embodiment using a gate-last process, the gate stack 1102 is a dummy gate stack and will be replaced by the final gate stack at a subsequent processing stage of the device 200. In particular, the gate stack 1102 may be replaced at a later processing stage by a high-K dielectric layer (HK) and metal gate electrode (MG). In some embodiments, the gate stack is formed over the substrate 202 and is at least partially disposed over the fin elements 602. In one embodiment, the gate stack 1102 includes a dielectric layer 1106, an electrode layer 1108, and a hard mask 1110. In some embodiments, the gate stack 1102 is formed by various process steps such as layer deposition, patterning, etching, as well as other suitable processing steps. In some examples, the layer deposition process includes CVD (including both low-pressure CVD and plasma-enhanced CVD), PVD, ALD, thermal oxidation, e-beam evaporation, or other suitable deposition techniques, or a combination thereof. In some embodiments, the patterning process includes a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etching process may include dry etching (e.g., RIE etching), wet etching, and/or other etching methods.

In some embodiments, the dielectric layer 1106 of the gate stack 1102 includes silicon oxide. Alternatively or additionally, the dielectric layer 1106 of the gate stack 1102 may include silicon nitride, a high-K dielectric material or other suitable material. In some embodiments, the electrode layer 1108 of the gate stack 1102 may include polycrystalline silicon (polysilicon). In some embodiments, the hard mask 1110 of the gate stack 1102 includes a suitable dielectric material, such as silicon nitride, silicon oxynitride or silicon carbide.

In various embodiments, the sidewall spacers 1104 are disposed on the sidewalls of the gate stack 1102. The sidewall spacers 1104 may include a dielectric material such as silicon oxide, silicon nitride, silicon carbide, silicon oxynitride, or combinations thereof. In some embodiments, the sidewall spacers 1104 include multiple layers, such as main spacer walls, liner layers, and the like. By way of example, the sidewall spacers 1104 may be formed by depositing a dielectric material over the gate stack 1102 and anisotropically etching back the dielectric material. In some embodiments, the etch-back process (e.g., for spacer formation) may include a multiple-step etching process to improve etch selectivity and provide over-etch control. In some embodiments, prior to forming the sidewall spacers 1104, an ion implantation process may be performed to form lightly-doped drain (LDD) features within the semiconductor device 200. In other embodiments, such LDD features may be formed by epitaxial growth of an in-situ doped layer prior to forming the sidewall spacers 1104. In some embodiments, a plasma doping (PLAD) process may be used to form the LDD features. In yet other embodiments, an ion implantation process may be performed after forming the sidewall spacers 1104 to form the LDD features. In some embodiments, after formation of the LDD features, the semiconductor device 200 may be subject to a high thermal budget process (anneal) to remove defects and activate dopants (i.e., to place dopants into substitutional sites). It should be noted that in accordance with various embodiments, any potential diffusion of APT dopants previously implanted and disposed within the substrate regions 202A (e.g., due to high thermal budget processing), will be blocked from diffusing into the FinFET channel regions (i.e., the second epitaxial layer portion 504A) by the fully oxidized layer 502C (now merged with the isolation regions 902).

The method 100 then proceeds to block 122 where the fin elements are etched. Referring to the example of FIGS. 11 and 12, in an embodiment of block 122, portions of the fin elements 602 on either side of the gate stack 1102 may be etched. The etched portions of the fin elements 602 may include portions of the fin elements 602 within source/drain regions 1202, 1204 on either side of the gate stack 1102. In some embodiments, the etching of the portions of the fin elements 602 may be performed using a dry etching process, a wet etching process, and/or a combination thereof. Additionally, in some embodiments, portions of the oxide regions beneath the etched portions of the fin elements 602, which may include oxide layer 502C or the oxide layer 502C and portions of isolation regions 902, are also etched. In some embodiments, etching the oxide regions beneath the etched portions of the fin elements 602 exposes the underlying substrate regions 202A. In various embodiments, the etching of the oxide regions beneath the etched portions of the fin elements 602 may be performed using a dry etching process, a wet etching process, and/or a combination thereof. It is noted that in the embodiments disclosed herein, the oxide layer 502C (or the oxide layer 502C and portions of the isolation regions 902) remains present beneath the gate stack 1102, serving to block diffusion of APT dopants from within the substrate regions 202A into the device channel region (i.e., the second epitaxial layer portion 504A covered by the gate stack 1102).

The method 100 then proceeds to block 124 where source/drain features are formed. Referring to the example of FIGS. 12 and 13, in an embodiment of block 124, source/drain features 1302, 1304 are formed in source/drain regions 1202, 1204. In some embodiments, the source/drain features 1302, 1304 are formed by epitaxially growing a semiconductor material layer in the source/drain regions 1202, 1204. In some examples, dummy sidewall spacers may be formed prior to epitaxial source/drain growth and removed after epitaxial source/drain growth. Additionally, in some embodiments, the main sidewall spacers may be formed, as described above, after epitaxial source/drain growth. In various embodiments, the semiconductor material layer grown in the source/drain regions 1202, 1204 may include Ge, Si, GaAs, AlGaAs, SiGe, GaAsP, SiP, or other suitable material. The source/drain features 1302, 1304 may be formed by one or more epitaxial (epi) processes. In some embodiments, the source/drain features 1302, 1304 may be in-situ doped during the epi process. For example, in some embodiments, epitaxially grown SiGe source/drain features 1302, 1304 may be doped with boron. In some embodiments, epitaxially grown Si epi source/drain features 1302, 1304 may be doped with carbon to form Si:C source/drain features, phosphorous to form Si:P source/drain features, or both carbon and phosphorous to form SiCP source/drain features 1302, 1304. In some embodiments, the source/drain features 1302, 1304 are not in-situ doped, and instead an implantation process is performed to dope the source/drain features 1302, 1304. In various embodiments, a doping dose used to dope the source/drain features 1302, 1304 is greater than a doping dose used to dope the LDD features. In some embodiments, formation of the source/drain features 1302, 1304 may be performed in separate processing sequences for each of N-type and P-type source/drain features 1302, 1304. In some embodiments, after formation of the source/drain features 1302, 1304, an epi anneal process may be performed, where the semiconductor device 200 is subjected to a high thermal budget process. However, as described above, the oxide layer (e.g., the oxide layer 502C) which remains present beneath the gate stack 1102, will block any potential diffusion of APT dopants from within the substrate regions 202A into the device channel region (i.e., the second epitaxial layer portion 504A covered by the gate stack 1102) during such high thermal budget processing.

The method 100 then proceeds to block 126 where an inter-layer dielectric (ILD) layer is formed and the dummy gate stack is removed. Referring to the example of FIGS. 13 and 14, in an embodiment of block 126, an ILD layer 1402 is formed over the substrate 202. In some embodiments, a contact etch stop layer (CESL) is formed over the substrate 202 prior to forming the ILD layer 1402. In some examples, the CESL includes a silicon nitride layer, silicon oxide layer, a silicon oxynitride layer, and/or other materials known in the art. The CESL may be formed by plasma-enhanced chemical vapor deposition (PECVD) process and/or other suitable deposition or oxidation processes. In some embodiments, the ILD layer 1402 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 1402 may be deposited by a PECVD process or other suitable deposition technique. In some embodiments, after formation of the ILD layer 1402, the semiconductor device 200 may be subject to a high thermal budget process to anneal the ILD layer. As described above, the oxide layer (e.g., the oxide layer 502C) blocks any potential diffusion of APT dopants from within the substrate regions 202A into the device channel region during such high thermal budget processing. In some examples, a planarization process may be performed to expose a top surface of the dummy gate stack 1102. For example, a planarization process includes a chemical mechanical planarization (CMP) process which removes portions of the ILD layer 1402 (and CESL layer, if present) overlying the dummy gate stack 1102 and planarizes a top surface of the semiconductor device 200. In addition, the CMP process may remove the hard mask 1110 overlying the dummy gate stack 1102 to expose the electrode layer 1108, such as a polysilicon electrode layer. Thereafter, in some embodiments, the remaining previously formed dummy gate stack 1102 features (e.g., the dielectric layer 1106 and the electrode layer 1108) are removed from the substrate. The removal of the dielectric layer 1106 and the electrode layer 1108 from the gate stack 1102 may result in a trench 1404, and a final gate structure (e.g., including a high-K dielectric layer and metal gate electrode) may be subsequently formed in the trench 1404, as described below. The removal of the dummy gate stack features may be performed using a selective etch process such as a selective wet etch, a selective dry etch, or a combination thereof.

The method 100 then proceeds to block 128 where a high-K/metal gate stack is formed. Referring to the example of FIGS. 14 and 15, in an embodiment of block 128, a high-K/metal gate stack 1502 is formed within the trench 1404 of the device 200. In various embodiments, the high-K/metal gate stack includes an interfacial layer formed over the substantially dopant-free channel material of the fin (i.e., the second epitaxial layer portion 504A), a high-K gate dielectric layer formed over the interfacial layer, and a metal layer formed over the high-K gate dielectric layer. High-K gate dielectrics, as used and described herein, include dielectric materials having a high dielectric constant, for example, greater than that of thermal silicon oxide (~3.9). The metal layer used within high-K/metal gate stack may include a metal, metal alloy, or metal silicide. Additionally, the formation of the high-K/metal gate stack includes depositions to form various gate materials and one or more CMP processes to remove excessive gate materials and thereby planarize a top surface of the semiconductor device 200.

In some embodiments, the interfacial layer of the high-K/metal gate stack 1502 may include a dielectric material such as silicon oxide ($SiO_2$), HfSiO, or silicon oxynitride (SiON). The interfacial layer may be formed by chemical oxidation, thermal oxidation, atomic layer deposition (ALD), chemical vapor deposition (CVD), and/or other suitable method. The gate dielectric layer of the high-K/metal gate stack 1502 may include a high-K dielectric layer such as hafnium oxide ($HfO_2$). Alternatively, the gate dielectric layer of the high-K/metal gate stack 1502 may include other high-K dielectrics, such as $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), combinations thereof, or other suitable material. The high-K gate dielectric layer may be formed by ALD, physical vapor deposition (PVD), CVD, oxidation, and/or other suitable methods. The metal layer of the high-K/metal gate stack 1502 may include a single layer or alternatively a multi-layer structure, such as various combinations of a metal layer with a selected work function to enhance the device performance (work function metal layer), liner layer, wetting layer, adhesion layer, metal alloy or metal silicide. By way of example, the metal layer of the high-K/metal gate stack 1502 may include Ti, Ag, Al, TiAlN, TaC, TaCN, TaSiN, Mn, Zr, TiN, TaN, Ru, Mo, Al, WN, Cu, W, Re, Ir, Co, Ni, other suitable metal materials or a combination thereof. In addition, the metal layer may provide an N-type or P-type work function, may serve as a transistor (e.g., FinFET) gate electrode, and in at least some embodiments, the metal layer of the high-K/metal gate stack 1502 may include a polysilicon layer. In various embodiments, the metal layer of the high-K/metal gate stack 1502 may be formed by ALD, PVD, CVD, e-beam evaporation, or other suitable process. Further, the metal layer of the high-K/metal gate stack 1502 may be formed separately for N-FET and P-FET transistors which may use different metal layers. In various embodiments, a CMP process may be performed to remove excessive metal from the metal layer of the high-K/metal gate stack 1502, and thereby provide a substantially planar top surface of the metal layer of the high-K/metal gate stack 1502.

The semiconductor device 200 may undergo further processing to form various features and regions known in the art. For example, subsequent processing may form interlayer dielectric (ILD) layer(s), contact openings, contact metal, as well as various contacts/vias/lines and multilayers interconnect features (e.g., metal layers and interlayer dielectrics) on the substrate 202, configured to connect the various features to form a functional circuit that may include one or more FinFET devices. In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure. Moreover, additional process steps may be implemented before, during, and after the method 100, and some process steps described above may be replaced or eliminated in accordance with various embodiments of the method 100.

Figure 15:
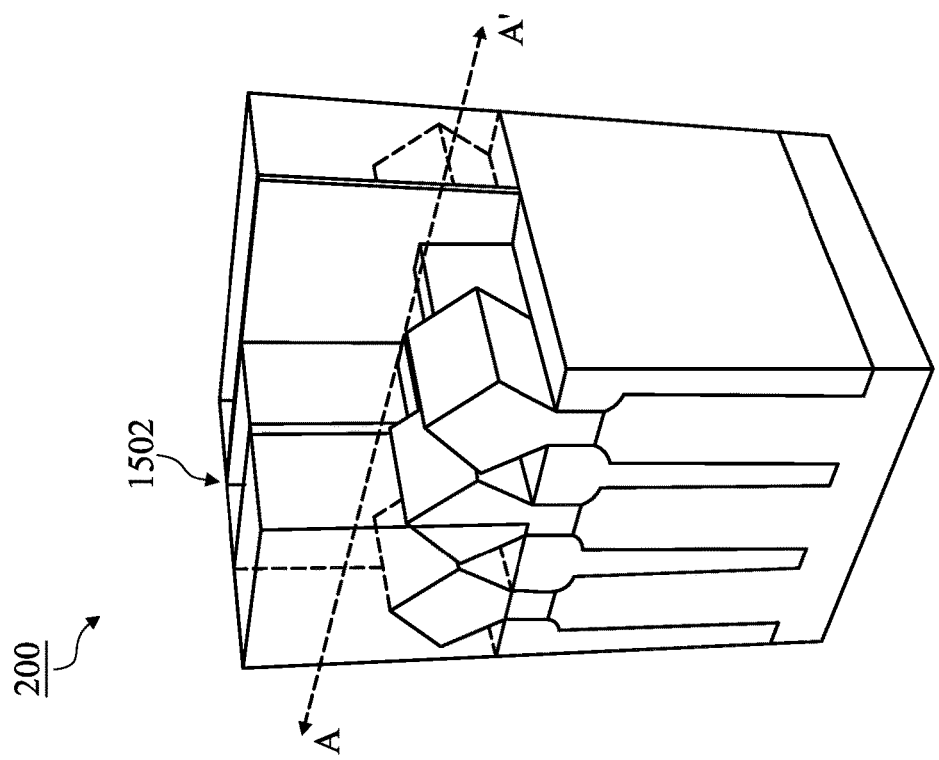
Figure 14:
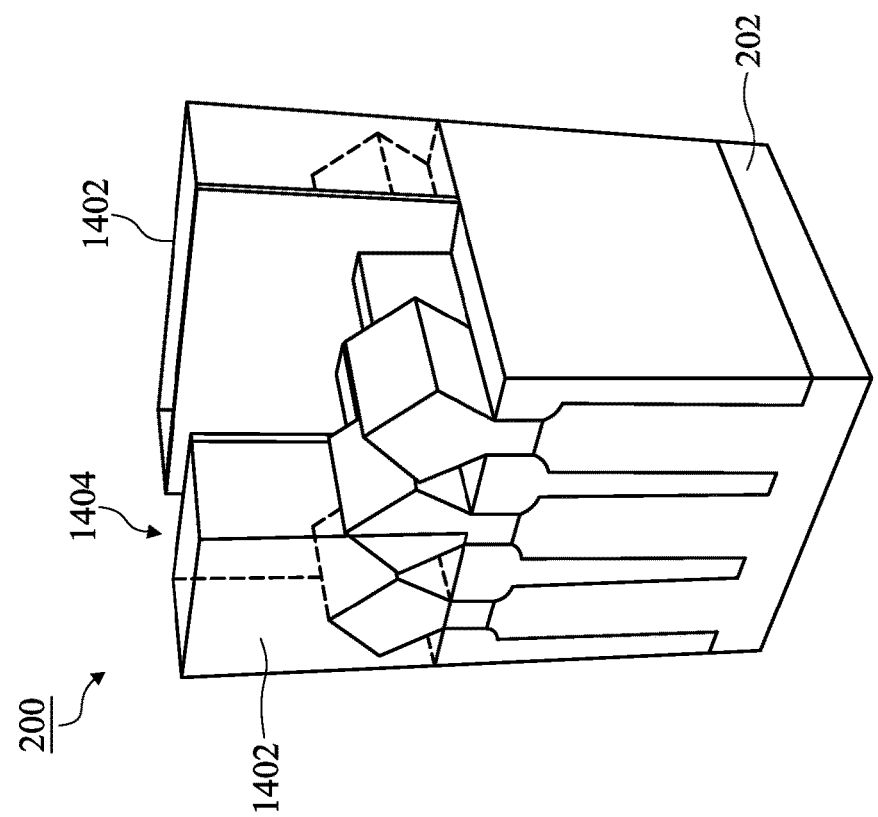

Referring now to FIGS. 16 and 17, illustrated therein are cross-section views of the device 200 along a plane substantially parallel to section AA' of FIG. 15. In particular, the examples of FIGS. 16 and 17 include cross-sectional views of the substrate portion 202A (which may include APT dopants previously implanted into the substrate 202), the second epitaxial layer portion 504A (which serves as the device 200 channel region), oxidized layer 502C (merged with isolation regions 902), and the high-K/metal gate stack 1502. As described above, in some embodiments, the first epitaxial layer portion 502A (FIG. 6) may include SiGe, and the second epitaxial layer portion 504A may include Si. In such embodiments, the oxidation process (block 112) may not fully oxidize the SiGe of the first epitaxial layer portion 502A, resulting in Ge residue 1602, 1604, as shown in FIG. 16. In various embodiments, a Ge concentration of each of the Ge residue 1602, 1604 may be in a range from about 1-20%. In some examples, the Ge residue 1602 includes Ge bonded to Si (e.g., of the substrate portion 202A or the second epitaxial layer portion 504A). In various embodiments, the Ge residue 1604 includes non-bonding Ge residue. Such non-bonding Ge residue 1604 is free to out-diffuse (e.g., into the high-K/metal gate stack 1502) and is thus a reliability concern for electrical performance of the device 200. The bonded Ge residue 1602, in part due to its immobility, may not cause a similar reliability concern. Due to the potential reliability issues associated with the Ge residue 1604, it is desirable to eliminate such Ge residue. Therefore, in some embodiments, the device 200 may be subjected to a low-pressure anneal that can effectively remove the non-bonding Ge residue 1604. By way of example, the device 200 may be subjected to a low-pressure anneal performed at a pressure of about $1 \times 10^{-5}$ ATM, within a temperature range of about 600-900° C., and for a time of about 1-10 minutes. After exposing the device 200 to such a low-pressure anneal, the Ge residue 1604 may be eliminated and/or redistributed, as shown in FIG. 17. In some embodiments, the bonded Ge residue 1602 may still remain after the low-pressure anneal, as also illustrated in FIG. 17;

however, as described above, such bonded Ge residue 1602 does not cause the same reliability concern as the mobile, non-bonding Ge residue 1604.

Figure 18:
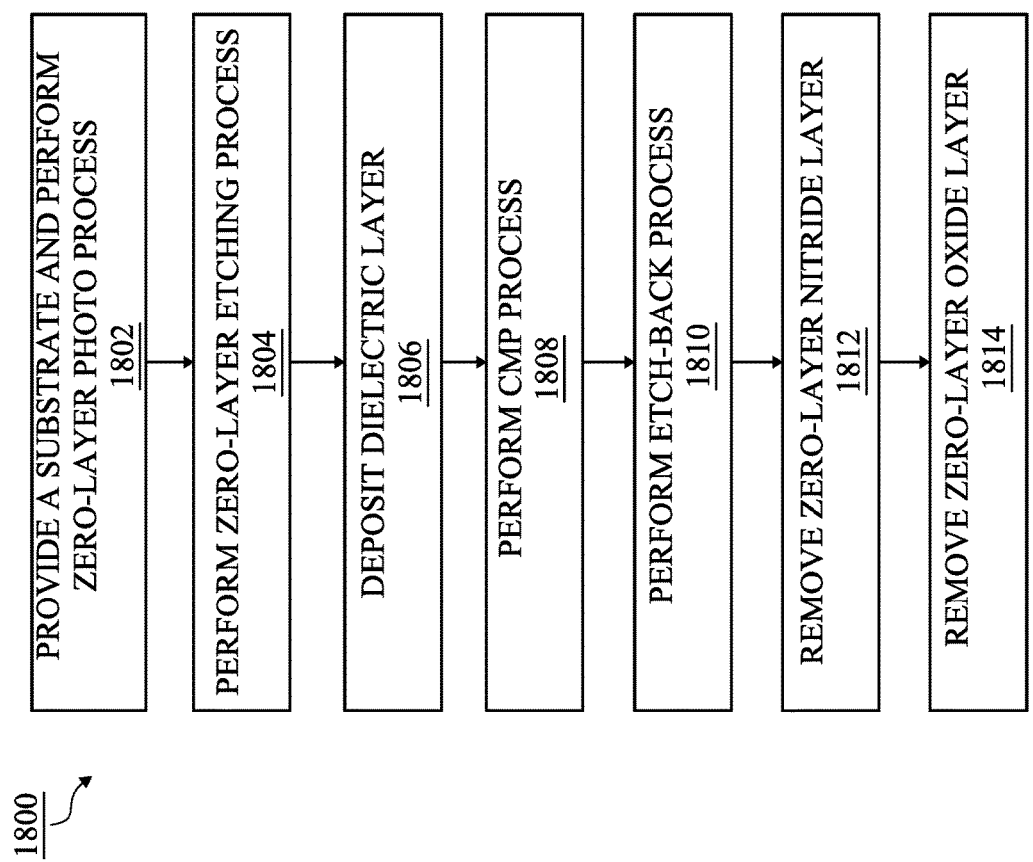
FIG. 18 is a flow chart of a method of fabricating a zero-layer alignment mark according to one or more aspects of the present disclosure.

With reference now to FIGS. 18, illustrated therein is a method 1800 of forming zero-layer alignment marks, according to some embodiments. FIGS. 19-25 are cross-section views of an embodiment of the semiconductor device 200 according to various stages of the method 1800 of FIG. 18. In various embodiments, the method 1800 may be used to form, for example, the zero-layer alignment mark 204 (FIG. 2) and the plurality of alignment marks 204 formed within the top surface 304 of the semiconductor wafer 302 (FIG. 3).

The method 1800 begins at block 1802 where a substrate is provided and a zero-level photolithography process is performed. Referring to FIG. 19, in an example of block 1802, a substrate 1902 is provided. In some embodiments, the substrate 1902 may be the substrate 202 described above. As shown in FIG. 19, a dielectric layer 1904 may be formed over the substrate 1902. In some embodiments, the dielectric layer 1904 includes a pad oxide layer (e.g., $SiO_2$) which may include thermally grown oxide, CVD-deposited oxide, and/or ALD-deposited oxide. In some examples, the dielectric layer 1904 has a thickness of about 60 Angstroms. In some embodiments, a dielectric layer 1906 may be formed over the dielectric layer 1904. In some embodiments, the dielectric layer 1906 includes a pad nitride layer (e.g., $Si_3N_4$) which may be deposited by CVD or other suitable technique. In some examples, the dielectric layer 1906 has a thickness of about 380 Angstroms. In some embodiments, a dielectric layer 1908 may be formed over the dielectric layer 1906. In some cases, the dielectric layer 1908 includes an oxide layer (e.g., $SiO_2$, TEOS, or other suitable dielectric material) which may be deposited by CVD, PECVD, ALD, or other suitable technique. In some examples, the dielectric layer 1908 has a thickness of about 800 Angstroms.

In some embodiments, as part of performing the zero-level photolithography process, a photoresist layer (resist) is formed over the dielectric layer 1908. In some examples, the resist layer includes a multi-layer resist 1910 having a first resist layer 1912 and a second resist layer 1914. In some embodiments, the first resist layer has a thickness of about 800 Angstroms, and the second resist layer 1914 has a thickness of about 2400 Angstroms. In various embodiments, the multi-layer resist 1910 is exposed to a pattern (e.g., using a zero-level alignment mark mask), a post-exposure bake process is performed, and the resist is developed, thereby form a pattern 1916 in the second resist layer 1914.

The method 1800 proceeds to block 1804 where a zero-layer etching process is performed. Referring to FIGS. 19 and 20, in an example of block 1804, after formation of the pattern 1916 in the second resist layer 1914, the pattern may be transferred to underlying layers by performing an anisotropic plasma etching process, enabling a vertical pattern transfer. In some embodiments, the anisotropic plasma etching process may etch through the first resist layer 1912, the dielectric layers 1908, 1906, 1904, and into the substrate 1902. Thus, the anisotropic etching process transfers the pattern 1916 from the second resist layer 1914 to the underlying layers, labeled as pattern 1916A, and forming a plurality of trenches 2002 within the substrate 1902. In some embodiments, the first resist layer 1912 may be stripped (e.g., using a solvent or other suitable resist stripper) after completion of the anisotropic etching process.

Figure 21:
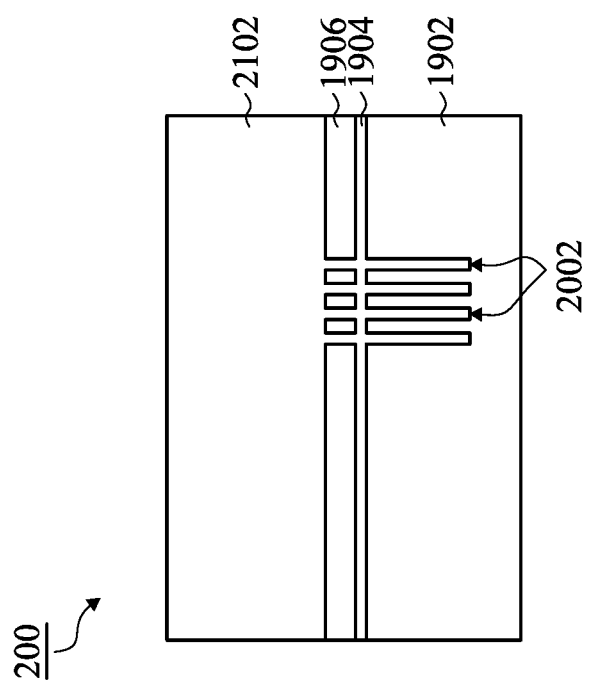

The method 1800 proceeds to block 1806 where a dielectric layer is deposited and annealed. Referring to FIGS. 20 and 21, in an example of block 1806, a dielectric layer 2102 may be deposited over the substrate 1902 and into the trenches 2002. In some embodiments, the dielectric layer 2102 includes $SiO_2$, silicon nitride, silicon oxynitride, fluorine-doped silicate glass (FSG), a low-k dielectric, combinations thereof, and/or other suitable materials known in the art. In various embodiments, the dielectric layer 2102 may be deposited by a CVD process, a subatmospheric CVD (SACVD) process, a flowable CVD process, an ALD process, a PVD process, or other suitable process. In some embodiments, after formation of the dielectric layer 2102, the device 200 may be subjected to an anneal process to improve the quality of the dielectric layer 2102.

Figure 22:
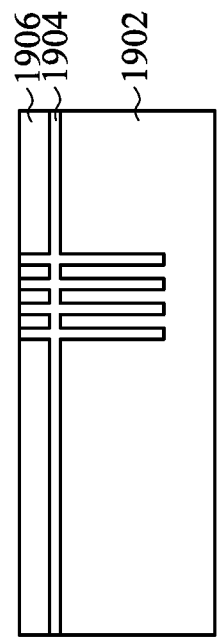
Figure 23:
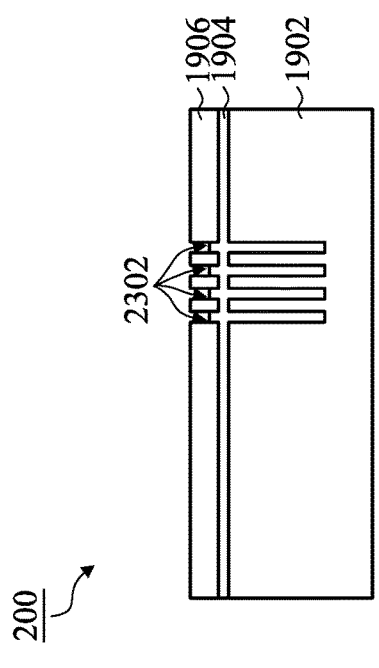
Figure 24:
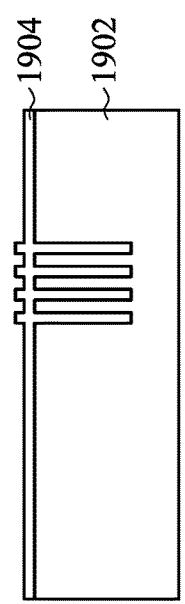
Figure 25:
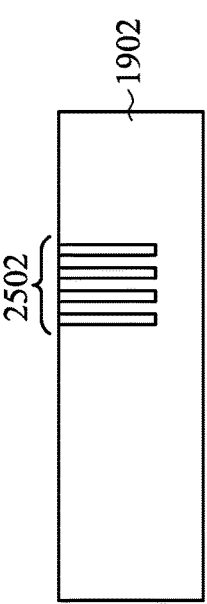

The method 1800 proceeds to block 1808 where a CMP process is performed. Referring to FIGS. 21 and 22, in an example of block 1808, the dielectric layer 2102 may be thinned and planarized by a CMP process. In some embodiments, after the CMP process, the device 200 may be subjected to an additional anneal process. The method 1800 proceeds to block 1810 where an etch-back process is performed. Referring to FIGS. 22 and 23, in an example of block 1810, the thinned and planarized dielectric layer 2102 (FIG. 22) may be etched-back to form trenches 2302 in the dielectric layer 1906 (FIG. 23). In some embodiments, the etch-back process may include a multiple-step etching process to improve etch selectivity and provide over-etch control. The method 1800 proceeds to block 1812 where the dielectric layer 1906 is removed. Referring to FIGS. 23 and 24, in an example of block 1812, the dielectric layer 1906 (e.g., the nitride layer) may be removed, for example, by way of a dry etching process, a wet etching process, or a combination thereof. The method 1800 proceeds to block 1814 where the dielectric layer 1906, as well as any dielectric that remained in the trenches 2302 after the etch-back process (block 1810), is removed. Referring to FIGS. 24 and 25, in an example of block 1814, the dielectric layer 1904 (e.g., the oxide layer) may be removed, for example, by way of a dry etching process, a wet etching process, or a combination thereof. In some embodiments, the dielectric layer 1904 (e.g., the oxide layer) may be removed, and a top surface of the device 200 planarized, by way of a CMP process. Thus, a zero-layer alignment mark 2502 is thereby formed within the substrate 1902 of the device 200. In various embodiments, the alignment mark 2502 may be the alignment mark 204 described above.

After formation of the alignment mark 2502, the semiconductor device 200 may undergo further processing to form various features and regions known in the art, as described above. In various embodiments, additional process steps may be implemented before, during, and after the method 1800, and some process steps described above may be replaced or eliminated in accordance with various embodiments of the method 1800. Moreover, while formation of the alignment mark 2502 has been shown and described with reference to specific examples, it will be understood by those skilled in the art that the alignment mark 2502 may be formed using any of a plurality of materials and/or processes without departing from the scope of the present disclosure.

Figure 27:
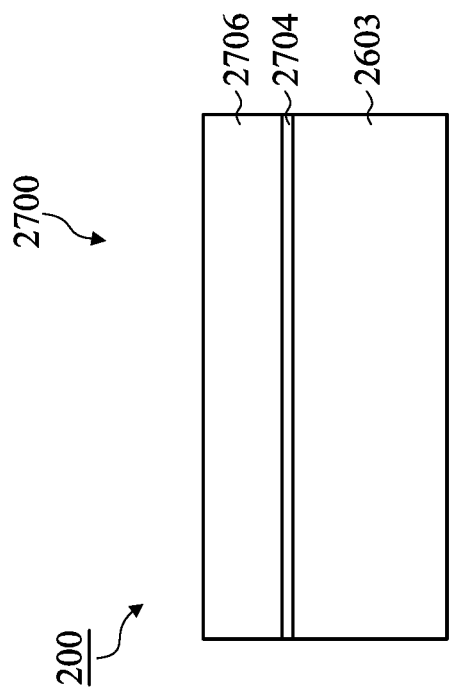
FIGS. 26 and 27 are cross-sectional views of the device 200 for two different regions of a substrate, in accordance with some embodiments.
Figure 26:
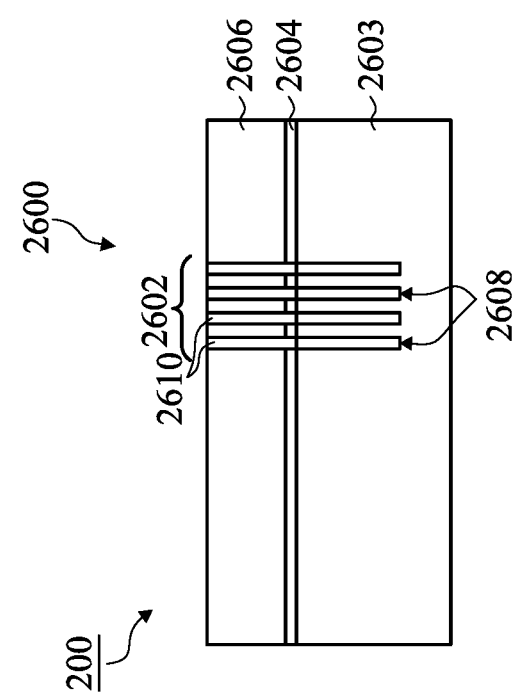

Referring to FIGS. 26 and 27, illustrated therein are cross-sectional views of the device 200 after epitaxial layer growth (e.g., after block 108 of the method 100). In particular, the examples of FIGS. 26 and 27 include cross-sectional views of two different regions of a substrate. By way of example, FIG. 26 illustrates an alignment region 2600 of a substrate 2603 including a zero-layer alignment mark 2602. In various embodiments, the alignment mark 2602 may be the alignment mark 2502 or 204, described above. Additionally, in some embodiments, the substrate 2603 may be the substrate 1902 or 202, described above. In some embodiments, the zero-layer alignment mark 2602 includes dielectric-filled trenches 2608, as described above. An epitaxial layer 2604 may be formed over the substrate 2603, and an epitaxial layer 2606 may be formed over the epitaxial layer 2604, as previously described. In various embodiments, due to the presence of the dielectric-filled trenches 2608, formation of the epitaxial layer 2606 results in the formation of polycrystalline layers 2610 over the dielectric-filled trenches 2608. In embodiments where the epitaxial layer 2606 includes silicon (Si), polycrystalline layers 2610 may include polycrystalline Si. FIG. 27 illustrates a device region 2700 of the substrate 2603. In various embodiments, the device region 2700 includes a region where a plurality of fin elements are subsequently formed, as described above, for FinFET device formation. In various embodiments, an epitaxial layer 2704 may be formed over the substrate 2603 in the device region 2700, and an epitaxial layer 2706 may be formed over the epitaxial layer 2704. In contrast to formation of the epitaxial layer 2606 in the alignment region 2600, formation of the epitaxial layer 2706 in the device region 2700 results in the formation of a uniform, undoped crystalline layer 2706 over the epitaxial layer 2704. Thus, the second epitaxial layer portion 504A (e.g., FIGS. 6/7), which serves as the FinFET device channel, will also include a uniform, undoped crystalline layer. In embodiments where the epitaxial layer 2706 includes silicon (Si), the epitaxial layer 2706, and thus the second epitaxial layer portion 504A, may include crystalline Si.

With respect to the description provided herein, the present disclosure offers methods and structures for avoiding degradation to semiconductor devices that can occur due to ion implantation processes, including defect formation and the introduction of channel impurities (i.e., unwanted channel dopants). In some examples, one or more APT ion implantation processes is performed prior to formation of FinFET fin elements. In some embodiments, an epitaxially grown undoped channel layer is formed over the APT-implanted substrate. Moreover, in various embodiments, the epitaxially grown undoped channel layer is separated from the APT-implanted substrate by a dielectric layer, which serves as a barrier to APT dopants. Because of this advantageous oxide barrier layer, the APT implant may have a high dopant concentration, for example, of between about $1 \times 10^{18}$ cm$^{-3}$ and $1 \times 10^{19}$ cm$^{-3}$. In some embodiments, because the epitaxially grown undoped channel layer is substantially free of dopants, carrier channel scattering is mitigated, and device mobility and drive current are improved. Embodiments of the present disclosure also provide a structure and process for forming zero-layer alignment marks, which can be used to readily align APT implants prior to formation of FinFET fin elements. The present disclosure further provides an anneal process, which may be employed to effectively eliminate and/or redistribute non-bonding molecular residue (e.g., non-bonding Ge residue). Those of skill in the art will readily appreciate that the methods and structures described herein may be applied to a variety of other semiconductor devices to advantageously achieve similar benefits from such other devices without departing from the scope of the present disclosure.

Thus, one of the embodiments of the present disclosure described a method for fabricating a semiconductor device (e.g., a FinFET device) having a substantially undoped channel region. In some embodiments, the method includes performing an ion implantation into a substrate. After performing the ion implantation, a first epitaxial layer is deposited over the substrate, and a second epitaxial layer is deposited over the first epitaxial layer. In various examples, a plurality of fins is formed extending from the substrate. Each of the plurality of fins includes a portion of the ion implanted substrate, a portion of the first epitaxial layer, and a portion of the second epitaxial layer. In some embodiments, the portion of the second epitaxial layer of each of the plurality of fins includes an undoped channel region. In various embodiments, the portion of the first epitaxial layer of each of the plurality of fins is oxidized.

In another of the embodiments, discussed is a method where a substrate including a first region and a second region is provided. In some cases, the first region includes a zero-layer alignment mark. In some examples, a photomask is aligned to the zero-layer alignment mark and a substrate implant region is patterned. In various embodiments, an ion implantation is performed into the patterned substrate implant region, thereby forming an ion-implanted substrate region. After performing the ion implantation, a first epitaxial layer may be deposited over the substrate and a second epitaxial layer may be deposited over the first epitaxial layer. In various examples, a plurality of fins extending from the substrate is formed in the second region. In some embodiments, each of the plurality of fins includes a portion of the ion-implanted substrate region, a first epitaxial layer region over the portion of the ion-implanted substrate region, and an undoped second epitaxial layer region over the first epitaxial layer region. The first epitaxial layer portion of each of the plurality of fins may then be oxidized.

In yet another of the embodiments, discussed is a semiconductor device including a substrate including an alignment region and a device region. In some examples, a plurality of fin elements is formed in the device region, where each of the plurality of fin elements includes a doped layer, a dielectric layer over the doped layer, and an undoped layer over the dielectric layer. In various embodiments, a gate stack is formed over the undoped layer. In addition, in some embodiments, the doped layer includes an anti-punch through doped region, and the undoped layer includes a channel region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor device, comprising:
a substrate including an alignment region and a device region, wherein the alignment region and the device region are two different regions of the substrate, and wherein the alignment region includes a plurality of dielectric-filled trenches;
a zero-layer alignment mark formed in the alignment region, wherein the zero-layer alignment mark includes the plurality of dielectric-filled trenches;
a polycrystalline layer over the plurality of dielectric-filled trenches;

a plurality of fin elements formed in the device region, wherein each of the plurality of fin elements includes a doped layer, a dielectric layer over the doped layer, and an undoped layer over the dielectric layer, wherein the doped layer includes an anti-punch through doped region, and wherein the undoped layer includes a channel region; and a gate stack formed over the undoped layer.

2. The semiconductor device of claim 1, wherein the dielectric layer has a thickness of between about 2-10 nm.

3. The semiconductor device of claim 1, wherein the doped layer includes doped Si, the dielectric layer includes oxidized SiGe, and the undoped layer includes undoped crystalline Si.

4. The semiconductor device of claim 1, wherein the polycrystalline layer includes polycrystalline Si.

5. The semiconductor device of claim 1, wherein the dielectric layer provides a barrier to diffusion of dopants from the anti-punch through doped region.

6. The semiconductor device of claim 1, wherein the dielectric layer is substantially free of non-bonding Ge residue.

7. A semiconductor device, comprising:
a plurality of fins extending from an ion implanted substrate, wherein each of the plurality of fins includes a portion of the ion implanted substrate, a portion of an oxidized layer over the portion of the ion implanted substrate, and a portion of an undoped layer over the portion of the oxidized layer, and wherein the portion of the undoped layer includes a channel region; and
a trench disposed between each of the plurality of fins, wherein the trench is filled with a dielectric material, and wherein the portion of the oxidized layer and the dielectric material are merged with each other;
wherein the ion implanted substrate includes at least one zero-layer alignment mark including a plurality of trenches filled with an oxide material, and wherein a first top surface of the ion implanted substrate and a second top surface of the oxide material are substantially co-planar; and
a polycrystalline Si layer formed over the plurality of trenches filled with the oxide material.

8. The semiconductor device of claim 7, wherein the portion of the undoped layer has a dopant concentration of less than about $1\times10^{17}$ cm$^{-3}$.

9. The semiconductor device of claim 7, wherein the portion of the ion implanted substrate of each of the plurality of fins has a dopant concentration of between about $1\times10^{18}$ cm$^{-3}$ and $1\times10^{19}$ cm$_{-3}$.

10. The semiconductor device of claim 7, wherein the portion of the oxidized layer includes an oxide of a first material having a first oxidation rate, and wherein the portion of the undoped layer includes a second material having a second oxidation rate less than the first oxidation rate.

11. The semiconductor device of claim 10, wherein the first material includes silicon germanium (SiGe) and the second material includes silicon (Si).

12. The semiconductor device of claim 7, wherein the portion of the oxidized layer is substantially free of non-bonding Ge residue.

13. A device, comprising:
a substrate including a first region and a second region different than the first region;
a plurality of fins formed in the second region and extending from the substrate, wherein each of the plurality of fins includes a portion of an ion-implanted substrate region, a diffusion barrier layer over the portion of the ion-implanted substrate region, and an undoped epitaxial layer over the diffusion barrier layer; and
a high-K/metal gate stack formed over the undoped epitaxial layer;
wherein the first region includes a zero-layer alignment mark having a plurality of dielectric-filled trenches, and a polycrystalline layer over the plurality of dielectric-filled trenches.

14. The device of claim 13, wherein the undoped epitaxial layer includes a channel region, and wherein the undoped epitaxial layer has a dopant concentration of less than about $1\times10^{17}$ cm$^{-3}$.

15. The device of claim 13, wherein the undoped epitaxial layer includes crystalline Si, and wherein the polycrystalline layer includes polycrystalline Si.

16. The device of claim 13, wherein the diffusion barrier layer includes an oxide of a first material having a first oxidation rate, and wherein the undoped epitaxial layer includes a second material having a second oxidation rate less than the first oxidation rate.

17. The device of claim 13, wherein the portion of an ion-implanted substrate region includes an anti-punch through (APT) dopant, and wherein the diffusion barrier layer blocks diffusion of the APT dopant into the undoped epitaxial layer.

18. The device of claim 13, wherein the diffusion barrier layer has a thickness of between about 2-10 nm.

19. The device of claim 13, wherein the undoped epitaxial layer has a thickness of between about 30-60 nm.

20. The device of claim 13, wherein the ion implanted substrate region includes doped Si, the diffusion barrier layer includes oxidized SiGe, and the undoped epitaxial layer includes undoped crystalline Si.

* * * * *